United States Patent [19]
Jun

[11] Patent Number: 5,880,023
[45] Date of Patent: Mar. 9, 1999

[54] PROCESS FOR FORMATION OF WIRING LAYER IN SEMICONDUCTOR DEVICE

[75] Inventor: Young-Kwon Jun, Seoul, Rep. of Korea

[73] Assignee: LG Semicon Co., Ldt., Chungcheongbuk-do, Rep. of Korea

[21] Appl. No.: 583,320

[22] Filed: Jan. 5, 1996

[30]     Foreign Application Priority Data

Jan. 6, 1995 [KR] Rep. of Korea ...................... 1995 133

[51] Int. Cl.$^6$ .................................................. H01L 21/44
[52] U.S. Cl. .......................... 438/652; 438/658; 438/659; 438/660; 438/688; 438/680; 438/632; 438/646
[58] Field of Search .................................. 438/652, 658, 438/659, 660, 688, 680, 646, 656, 662, 663, 674, 685, 687, 632

[56]     References Cited

U.S. PATENT DOCUMENTS

| | | | |
|---|---|---|---|
| 3,871,067 | 3/1975 | Bogardus et al. ....................... | 438/659 |
| 4,062,720 | 12/1977 | Alcorn et al. ............................ | 438/658 |
| 4,482,394 | 11/1984 | Heinecke ................................. | 438/659 |
| 4,489,482 | 12/1984 | Keyser et al. ........................... | 438/658 |
| 4,970,176 | 11/1990 | Tracy et al. ............................. | 437/187 |
| 5,147,819 | 9/1992 | Yu et al. .................................. | 438/688 |
| 5,164,332 | 11/1992 | Kumar ..................................... | 438/658 |
| 5,169,803 | 12/1992 | Miyakawa ............................... | 438/658 |
| 5,171,412 | 12/1992 | Talieh et al. ........................ | 204/192.15 |
| 5,179,042 | 1/1993 | Mikoshiba et al. ...................... | 437/187 |
| 5,236,866 | 8/1993 | Yasue ...................................... | 438/659 |
| 5,283,206 | 2/1994 | Sugano .................................... | 438/658 |
| 5,300,462 | 4/1994 | Kakumu ................................... | 438/659 |
| 5,371,042 | 12/1994 | Ong ......................................... | 438/688 |
| 5,409,862 | 4/1995 | Wada et al. ............................. | 438/658 |
| 5,420,069 | 5/1995 | Joshi et al. .............................. | 438/658 |
| 5,523,259 | 6/1996 | Merchant et al. ...................... | 438/688 |
| 5,654,232 | 8/1997 | Gardner .................................. | 438/661 |
| 5,693,564 | 12/1997 | Yu ............................................ | 438/688 |
| 5,789,317 | 8/1998 | Batra et al. ............................. | 438/642 |
| 5,798,296 | 8/1998 | Fazan et al. ............................ | 438/592 |

OTHER PUBLICATIONS

Kondoh et al.; "Interconnection Formation by Simultaneous Copper Doping in Chemical–Vapor–Deposited Aluminum (Aal–Cu CVD)"; IEDM 1993, pp. 277–280.

*Primary Examiner*—John F. Niebling
*Assistant Examiner*—Lynne A. Gurley
*Attorney, Agent, or Firm*—Loudermilk & Associates

[57]     ABSTRACT

A method for formation of a wiring layer in a semiconductor device, which includes the steps of: forming a first conductive layer upon a substrate; forming a second conductive layer on the first conductive layer, the second conductive layer having a melting point lower than that of the first conductive layer; and melting (or flowing) the second conductive layer. The first conductive layer is composed of aluminum or an aluminum alloy, and the impurity may be Si or Cu, while the second conductive layer has a melting point lower than that of the first conductive layer by 10° C. or more.

16 Claims, 3 Drawing Sheets

PROCESS FOR FORMATION OF WIRING LAYER IN SEMICONDUCTOR DEVICE

FIELD OF THE INVENTION

The present invention relates to processes for forming wiring layers in semiconductor devices, and more particularly to wiring layers which are suitable for high density devices.

BACKGROUND OF THE INVENTION

Generally, semiconductor integrated circuits include electrical wires of a conductive material for electrically connecting a plurality of circuit elements which are formed therein. As for the material of the metal wires, aluminum (Al) is widely used. Aluminum has the characteristics of low electrical resistivity, low price and relatively easy processing, and, therefore, aluminum is the most widely used conductive material.

An aluminum alloy containing 10% by weight of Si or Cu may be deposited by a sputtering method, thereby forming a wiring layer for carrying out a metallization process.

In accordance with the trend of high density and high integration of semiconductor devices, however, the step difference of the surface is increased in an underlayer of the wiring layer, and the aspect ratio of the contact holes is increased. Therefore, due to the inherent characteristics of the sputtering method, the angle of sputtered Al atoms which may reach inside of the contact hole is decreased. As a result, the problem of step coverage of a deposited aluminum layer is aggravated, with the result that the wire resistivity is increased, and the electromigration is increased, thereby adversely affecting the reliability of the metallization.

Meanwhile, as methods proposed for improving the deposition characteristics of an Al alloy layer, particularly the step coverage, there are: a method of melting an Al alloy using a laser; a method of carrying out a deposition while heating the wafer; and a method of carrying out a flattening in a dual manner by carrying out a collimator sputtering and a high temperature sputtering for ensuring a straight motion and directionality for the sputtered Al atoms. The above cited methods are for improving the existing sputtering method, and are in various stages of research. Besides attempts to improve the sputtering methods, studies are being conducted to improve the contact hole and step coverage by applying a low pressure chemical vapor deposition method in which the conformability of the deposited layer may be improved.

Particularly, a CVD method may simultaneously satisfy the filling of the contact hole and the conformability of the lines, and selective deposition is possible. Therefore, this method is expected to be a future wire forming method for integrated circuits. An example of an Al CVD method is disclosed in U.S. Pat. No. 5,179,042 (dated Jan. 12, 1993).

If a conductive layer (Al layer) is formed by applying a conventional CVD method, however, the CVD Al layer shows archipelago-like growth characteristics. Further, the CVD method is carried out at a temperature higher than that of the sputtering method. Further, if the wiring becomes fine, the contact areas between the grains are decreased, and, therefore, the electric resistance is increased, as well as causing problems of stress migration or electromigration. Further, within the contact hole, a void is likely to be formed near the center of the contact hole.

Actually, the cross section of the Al layer which is grown on an semiconductor substrate by applying a cold wall type LPCVD apparatus and through a pyrolysis of TIBA (Al $(C_4H_9)_3$) gas using an Al source can be observed through an SEM (scanning electron microscope). Through such an observation, it can be confirmed that the surface roughness occupies over one half.

If the Al layer which is formed by application of a CVD method is reflowed based on a conventional method, the Al layer varies in accordance with the step of the lower layer. If this layer is patterned into a wiring pattern, line breaks, electromigration or stress migration may occur, thereby lowering the reliability.

SUMMARY OF THE INVENTION

The present invention is intended to overcome the above-described disadvantages of the conventional techniques.

Therefore, it is an object of the present invention to provide a process for formation of a wiring layer in a semiconductor device, in which a conductive layer such as a CVD Al layer is flattened, so that the electrical resistivity and reliability may be improved in a process with fine patterning.

It is another object of the present invention to provide a process for formation of a wiring layer in a semiconductor device, in which a flattening is carried out at a reflow step without varying the total thickness of the conductive layer, thereby improving the conformability and the reproducibility.

In achieving the above and other objects, the process for formation of a wiring layer in a semiconductor device according to the present invention includes the steps of: forming a first conductive layer upon a substrate; forming a second conductive layer upon the first conductive layer, the second conductive layer having a melting point lower than that of the first conductive layer; and flowing the second conductive layer.

The first conductive layer is formed by applying a chemical vapor deposition method, and the second conductive layer may be formed by ion-implanting an impurity into the first conductive layer, or alternatively by depositing the second conductive layer upon the first conductive layer by applying a chemical vapor deposition method or a sputtering method.

The first conductive layer may be composed of aluminum or an aluminum alloy, and the impurity may be Si or Cu, while the second conductive layer has a melting point lower than that of the first conductive layer by about 10° C. or more. Further, the aluminum alloy of the first conductive layer may be one (or more) of Al—Cu, Al—Ga, Al—Ge, Al—Pd, Al—Si, Al—Sn, Al—V.

The surface contour may be improved in the following manner, so that the aluminum layer or aluminum alloy layer may be subjected to a fine patterning. That is, a low melting point layer is formed upon a CVD conductive layer, and a heat treatment is carried out, so that the low melting point layer would be melted, thereby flattening the surface of the CVD conductive layer.

As the source gas for the chemical vapor deposition, there may be used one of TIBA Al$(C_4H_9)_3$ (triisobutyl aluminum), DMAH AlH$(CH_3)_2$ (dimethyl aluminum hydride), TMAA $(CH_3)_3$N: AlH$_3$ (trimethyl aminealane), DMEAA $(CH_3)_2C_2H_5$: AlH$_3$ (dimethyethyl aminealane) and AlCl$_3$. In order to form the low melting point layer, an aluminum alloy layer containing aluminum and one (or more) of Si, Cu, Ga, Ge, Pd, Sn, V is formed upon a CVD aluminum layer by applying a sputtering method. As an alternative, one of the above cited impurities is ion-implanted into the surface of the CVD aluminum layer. The low melting point aluminum alloy layer is made to have a melting point lower than that of the CVD aluminum layer. Then, the wafer is heated up to the temperature at which the low melting point aluminum alloy layer is melted or undergoes viscous flow. Thus, the aluminum alloy layer is melted, so that the surface of the aluminum base layer may be flattened, and that air pores may be buried.

During the heat treatment, the CVD aluminum base layer basically is maintained in a solid state, and, therefore, only the surface of the aluminum base layer under the low melting point aluminum alloy layer is flattened, without causing a variation in the thickness of the CVD aluminum base layer. Therefore, the thickness of the total aluminum wiring layer does not vary, unlike the general aluminum base layer reflow heat treatment.

BRIEF DESCRIPTION OF THE DRAWINGS

The above objects and other advantages of the present invention will become more apparent by describing in detail the preferred embodiments of the present invention with reference to the attached drawings in which.

DESCRIPTION OF THE PREFERRED EMBODIMENTS

Figure 1:
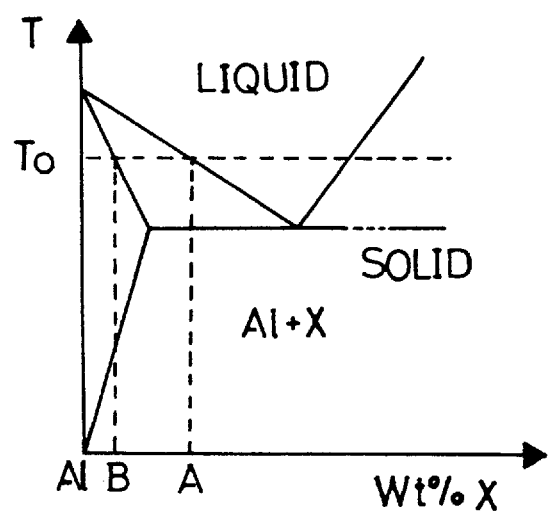
FIG. 1 illustrates a phase diagram for an aluminum alloy used in the present invention.

FIG. 1 illustrates a phase diagram of an Al+material X system in which material X is dissolved in Al to illustrate a principle of the present invention. Axis Y indicates a temperature scale, and axis X indicates the weight percentage Wt % of material X dissolved in aluminum. The solubility of material X in aluminum rises as the temperature increases. "A" and "B" on the X axis indicates the Wt % of material X dissolved in Al, and A Wt % is less than B Wt %. An alloy of Al+A Wt % X (an Al alloy including A Wt % of material X) has a melting point lower than an alloy of Al+B Wt % X.

If the two alloys are heated to a temperature $T_o$, the alloy of Al+B Wt % X is maintained in a solid state, but the alloy of Al+A Wt % X turns into a liquid state. The liquid phase temperature of an aluminum alloy having alloy ratio A is lower than the liquid phase temperature of an aluminum alloy having alloy ratio B. That is, if A>B, a temperature TA at which the alloy of alloy ratio A is liquefied is lower than a temperature TB at which the alloy of alloy ratio B is liquefied. That is, the liquefying temperature becomes TA<TB.

The material X which can be dissolved in Al may include Si, Cu, Ga, Ge, Pd, Sn and V.

If this principle is applied to the present invention, the upper layer in which the impurity content is larger than that of the CVD base layer is first melted under a heat treatment. Under this condition, viscous flow may occur, so that the surface would be flattened. For example, after forming a lower layer of Al+B wt % X and forming an upper layer of Al+A Wt % X, a heat treatment at temperature $T_o$ causes the upper layer to undergo viscous flow, while the lower layer remains in a solid state.

Figure 2A:
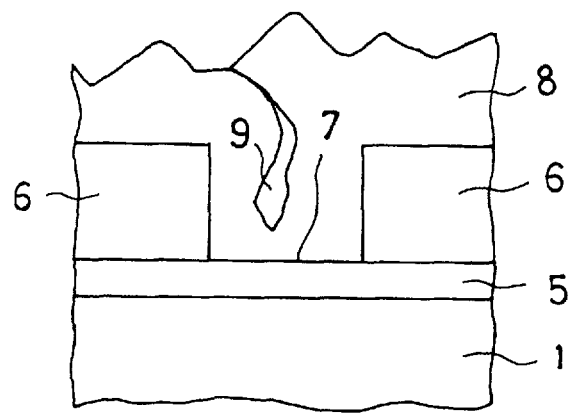
FIGS. 2A, 2B and 2C are partial sectional views illustrating respective steps of an embodiment of the process for formation of a wiring layer according to the present invention.
Figure 2B:
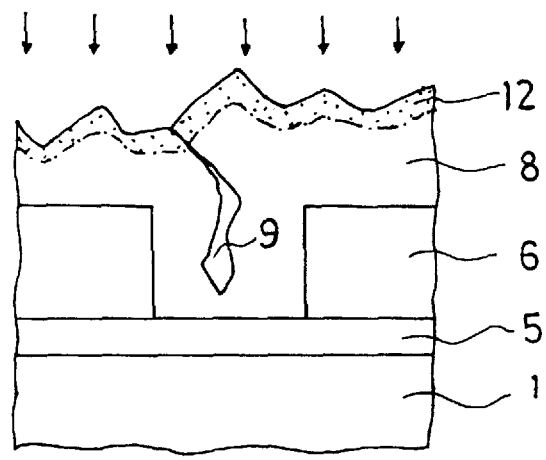
Figure 2C:
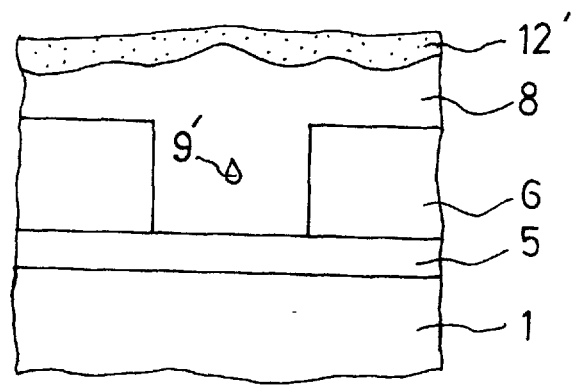

FIGS. 2A to 2C are partial sectional views illustrating a method of forming a low melting point layer on a lower layer for forming an upper layer, which has a melting point lower than that of the lower layer, by impurity ion-implanting a material selected one from the group consisting of Si, Cu, Ga, Ge, Pd, Sn and V into the surface of the lower layer. This method is one preferred embodiment of the present invention.

First, as illustrated in FIG. 2A, impurity doped conductive region 5 is formed on semiconductor substrate 1, and oxide layer 6 as an insulating layer is formed on substrate 1. A photo etching method is applied to oxide layer 6 to form contact hole 7, and aluminum as first conductive layer 8 is deposited on/over oxide layer 6 and contact hole 7. Thus, contact hole 7 is formed to connect first conductive layer 8 to conductive region 5.

In the case where there is formed an aluminum layer as first conductive layer 8, first conductive layer 8 may be a CVD aluminum layer, which may be formed to a thickness of about 6000 Angstroms by applying an LPCVD method at a temperature of about 250°–450° C., and by using a metal organic source such as DMAH AlH(CH$_3$)$_2$ (dimethyl aluminum hydride), or an inorganic source such as AlCl$_3$ as the aluminum source.

As illustrated in FIG. 2B, impurity ions such as Si, Cu or the like are implanted with an acceleration energy of about 10–100 KeV and at a concentration of about $10^{12}$–$10^{15}$ atoms/cm$^2$ into the surface of aluminum layer 8. Thus, second conductive layer 12 having impurity ions implanted therein is formed, and the melting point of first conductive layer 8 is higher than that of second conductive layer 12.

Under this condition, the implanted impurity ion concentration is determined such that second conductive layer 12 should have a melting point lower by about 10° C. than that of first conductive layer 8. Depending on the type of the impurities, the dose of impurity implant may become different. The phase diagram for the case where Al contains an impurity selected from among Si, Cu, Ga, Ge, Pd, Sn and V is disclosed in "Smithells Metal Reference Book" (Sixth Edition). Referring to this phase diagram, an impurity is implanted in such a dose that a difference of about 10° C. should be formed. The acceleration energy of the implant is determined such that the impurity ions may be implanted only into the surface of first conductive layer 8. The acceleration energy also is adjusted depending on the atomic mass of the impurity ions.

As illustrated in FIG. 2C, a heat treatment is carried out under an inert gas atmosphere at a temperature of about 400°–600° C., so that the implanted ions would be activated, and that second conductive layer 12 would be formed into an alloy layer. Thus, second conductive layer 12 turns into a viscous state to flatten first conductive layer 8.

Under this condition, not only the surface of first conductive layer 8 is flattened, but, also, in the case where void 9 exists in first conductive layer 8 as illustrated in the drawing, the impurity atoms intrude along the grain boundaries of the aluminum, so that the size of void 9 would be reduced to void 9' after the heat treatment.

Figure 3:
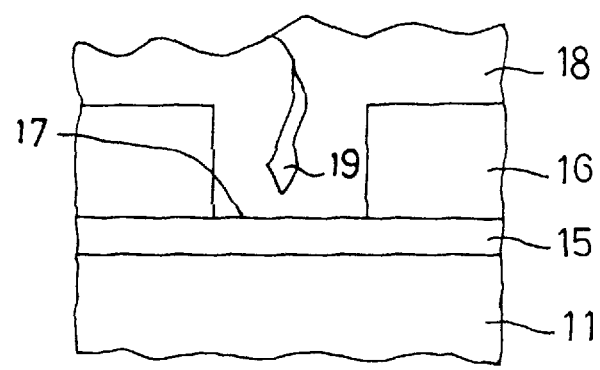
FIGS. 3A, 3B and 3C are partial sectional views illustrating respective steps of another embodiment of the process for formation a wiring layer according to the present invention.
Figure 3:
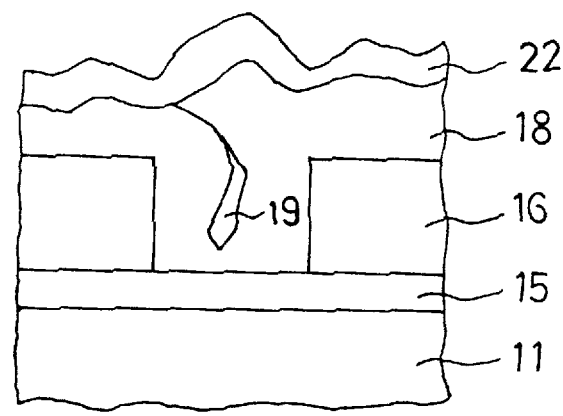
Figure 3:
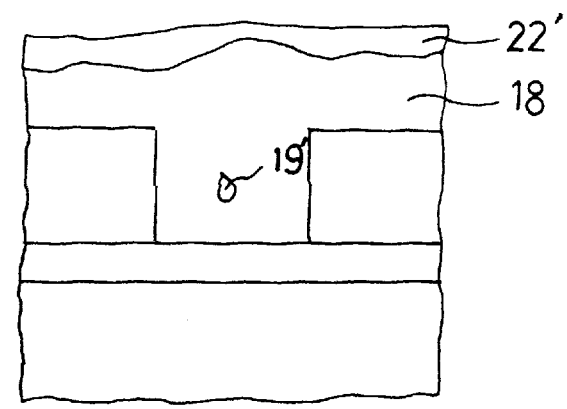

FIG. 3 illustrates another embodiment of the present invention, in which a conventional sputtering process is carried out, and then a heat treatment is carried out.

In this embodiment, a first step is carried out in the same manner as that of the first embodiment. That is, as illustrated in FIG. 3A, conductive region 15 with an impurity doped therein is formed in/upon semiconductor substrate 11. An oxide layer as insulating layer 16 is formed on substrate 11. Contact hole 17 is formed in insulating layer 16, and aluminum is deposited on/over contact hole 17 and insulating layer 16 to form first conductive layer 18. Thus, there is formed contact hole 17 which connects first conductive layer 18 to conductive region 15.

In the case where an aluminum layer is formed as first conductive layer 18, first conductive layer 18 may be formed as a CVD layer to a thickness of about 6000 Angstroms by applying a low pressure chemical vapor deposition method at a temperature of about 250°–450° C., using a metal organic source such as DMAH or an inorganic source such as $AlCl_3$ as the aluminum source.

As illustrated in FIG. 3B, by using as a target the aluminum alloy of the first conductive layer in which Si or Cu is contained in the surface thereof, second conductive layer 22 is formed to a thickness of about 2000 Angstroms by applying a general sputtering method at a temperature of about 100°–300° C. Under this condition, the composition of the aluminum alloy target is determined such that second conductive layer 22 should have a melting point lower by about 10° C. than that of first conductive layer 18. In this embodiment, the impurity which is used for the aluminum alloy is selected from a group consisting of Si, Cu, Ga, Ge, Pd, Sn and V.

As illustrated in FIG. 3C, a heat treatment is carried out at a temperature of about 400°–600° C. under an inert gas atmosphere, so that second conductive layer 22 would flow, and a flattening would occur. Under this condition, not only the surface of first conductive layer 18 is flattened, but, also, in the case where void 19 is formed in first conductive layer 18, the impurity atoms intrude along the grain boundaries of the aluminum. Thus, void 19 is reduced to void 19' after the heat treatment.

According to the present invention as described above, the surface of the CVD aluminum layer is flattened, and therefore the resistivity and reliability may be improved under a fine patterning. Unlike the conventional aluminum reflow method, the flattening can be carried out without being accompanied by a large variation of the total thickness of the aluminum wiring layer. Therefore, the conformability and mass productivity are improved.

The above descriptions are made based on the case in which the present invention is applied to flattening the surface of an aluminum layer. The present invention, however, also may be applied to flattening the surface of a Cu CVD layer, and other films composed of conductive materials.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method of fabricating a wiring layer in a semiconductor device, comprising the steps of:

forming a first conductive layer on an exposed portion of a substrate, wherein the first conductive layer remains on the exposed portion;

forming a second conductive layer on the first conductive layer, the second conductive layer having a melting point lower than that of the first conductive layer, wherein the second conductive layer is formed by implanting impurity ions into the first conductive layer or by applying a chemical vapor deposition method; and flowing the second conductive layer, wherein the flowing of the second conductive layer is conducted at a temperature and under conditions in which the first conductive layer does not flow, wherein the wiring layer is flattened.

2. The method of claim 1, wherein the first conductive layer is formed by applying a chemical vapor deposition method.

3. The method of claim 1, wherein the first conductive layer comprises aluminum or an aluminum alloy.

4. The method of claim 1, wherein the first conductive layer comprises aluminum or an aluminum alloy, and wherein the impurity ions comprise one or more elements selected from the group consisting of Si, Cu, Ga, Ge, Pd, Sn and V.

5. The method of claim 1, wherein the impurity ions are implanted with a dose such that the second conductive layer has a melting point lower than that of the first conductive layer by 10° C. or more.

6. The method of claim 1, wherein:

the first conductive layer comprises aluminum or an aluminum alloy; and the second conductive layer contains impurities to a level greater than the first conductive layer.

7. The method of claim 6, wherein the impurities comprise one or more elements selected from the group of Si, Cu, Ga, Ge, Pd, Sn and V.

8. The method of claim 6, wherein the second conductive layer has a melting point lower by about 10° C. or more than the melting point of the first conductive layer.

9. A method for fabricating a wiring layer in a semiconductor device comprising the steps of:

forming an insulating layer having a contact hole on a substrate;

forming a first conductive layer on the insulating layer and in the contact hole and on a portion of the substrate exposed by the contact hole, the first conductive layer having a first level of impurities, wherein the first conductive layer remains on the exposed portion;

forming a second conductive layer on the first conductive layer, the second conductive layer having a second level of impurities, wherein the second level of impurities is greater than the first level of impurities, wherein the second conductive layer is formed by implanting impurity ions into the first conductive layer or by applying a chemical vapor deposition method; and flowing the second conductive layer, wherein the flowing of the second conductive layer is conducted at a temperature and under conditions in which the first conductive layer does not flow, wherein the wiring layer is flattened.

10. A method of fabricating a wiring layer in a semiconductor device, comprising the steps of:

forming a conductive region on a semiconductor substrate;

forming an insulating layer on the conductive region;

etching the insulating layer to form a contact hole;

forming a first conductive layer on the insulating layer and in the contact hole, wherein the first conductive layer is formed on a portion of the conductive region exposed by the contact hole and remains on the exposed portion and is coupled to the conductive region through the contact hole;

forming a second conductive layer on the first conductive layer, wherein the second conductive layer is formed by implanting impurity ions into the first conductive layer or by applying a chemical vapor deposition method; and flowing the second conductive layer, wherein the flowing of the second conductive layer is conducted at a temperature and under conditions in which the first conductive layer does not flow, wherein the wiring layer is flattened.

11. The method of claim 10, wherein the first conductive layer is formed by applying a chemical vapor deposition method.

12. The method of claim 11, wherein the first conductive layer comprises aluminum or an aluminum alloy, and wherein the impurity ions comprise one or more elements selected from the group consisting of Si, Cu, Ga, Ge, Pd, Sn, and V.

13. The method of claim 10, the second conductive layer has a melting point lower than that of the first conductive layer by about 10° C. or more.

14. The method of claim 10, wherein the first conductive layer is formed by applying a chemical vapor deposition method, wherein the flowing step is performed by applying a heat treatment, wherein, after the heat treatment, the second conductive layer is flattened.

15. The method of claim 14, wherein the second conductive layer has a melting point lower than that of the first conductive layer by about 10° C. or more.

16. The method of claim 14, wherein the heat treatment is carried out at a temperature of about 400°–600° C. under an inert gas atmosphere.

* * * * *